United States Patent [19]

Schaber

[11] Patent Number: 4,752,589
[45] Date of Patent: * Jun. 21, 1988

[54] PROCESS FOR THE PRODUCTION OF BIPOLAR TRANSISTORS AND COMPLEMENTARY MOS TRANSISTORS ON A COMMON SILICON SUBSTRATE

[75] Inventor: Hans-Christian Schaber, Graefelfing, Fed. Rep. of Germany

[73] Assignee: Siemens Aktiengesellschaft, Berlin and Munich, Fed. Rep. of Germany

[*] Notice: The portion of the term of this patent subsequent to Apr. 12, 2005 has been disclaimed.

[21] Appl. No.: 931,630

[22] Filed: Nov. 17, 1986

[30] Foreign Application Priority Data

Dec. 17, 1985 [DE] Fed. Rep. of Germany ....... 3544599

[51] Int. Cl.[4] .......................................... H01L 21/265
[52] U.S. Cl. ......................................... 437/31; 437/34; 437/44; 437/59; 437/193; 357/59; 357/43; 148/DIG. 9
[58] Field of Search ................... 29/591, 578, 576 C, 29/58 C, 577 C; 148/188, DIG. 9, DIG. 124; 357/43, 59 H, 34; 156/653, 657; 437/31, 33, 41, 54, 57, 233

[56] References Cited

U.S. PATENT DOCUMENTS

4,637,125  1/1987  Iwasaki et al. ................... 29/576 E

FOREIGN PATENT DOCUMENTS

0139266  5/1985  European Pat. Off. ............. 357/43
0137055  7/1985  Japan ................................... 357/43

OTHER PUBLICATIONS

Alvarez et al. "2 Micron Merged Bipolar—CMOS Technology" 1984 IEDM Technical Digest pp. 761–764.

Wieder, "Self-Aligned Bipolar Technology–New Chances for Very-High Speed Digital Integrated Circuits" Siemens Forsch-u. Entwickl-Ber Bd 13 (1984).

Murrmann, "Modern Bipolar Technology for High-Performance ICs" Siemens Forsch-u. Entwickl Ber Bd 5 (1976).

Miyamoto et al., A 1.0um N-Well CMOS/Bipolar Technology for VLSI Circuits, IEE (1983).

Jacobs et al., "N- and P-Well Process Compatibility in a 1μm CMOS Technology" IEDM (1984).

Primary Examiner—Brian E. Hearn
Assistant Examiner—Kevin McAndrews
Attorney, Agent, or Firm—Hill, Van Santen, Steadman & Simpson

[57] ABSTRACT

A process for the simultaneous production of bipolar transistors and CMOS transistors on a substrate using very large circuit integration (VLSI) semiconductor technology, modified by additional process steps in such a way that a decoupling of the two types of transistors is obtained with respect to the process. This is achieved by the use of a protective oxide above the active zones of the CMOS transistors during the production of the bipolar-specific base zones and by employing a gate electrode material in two layers, the second layer being used for the emitter and collector zone, resulting in a decoupling of phosphorus doping used for forming MOS gates, and arsenic doping used for polysilicon emitters. The use of the same resist mask for the gate structuring and the production of the emitter contact, and also for the production of the source/drain terminal zones, serves to keep the implanted phosphorus out of the emitter zone. The process is used to produce VLSI circuits containing high speed CMOS and bipolar transistors.

7 Claims, 2 Drawing Sheets

PROCESS FOR THE PRODUCTION OF BIPOLAR TRANSISTORS AND COMPLEMENTARY MOS TRANSISTORS ON A COMMON SILICON SUBSTRATE

BACKGROUND OF THE INVENTION

1. Field of the Invention

The present invention provides a process for the simultaneous production of bipolar transistors and complementary MOS transistors on a common substrate utilizing known technology for the production of n- and p-doped zones, double-polysilicon-gate technology, and the production of npn-bipolar-transistors positioned in n-doped zones.

2. Description of the Prior Art

The present invention relates in particular to a process wherein the n-zones in which the bipolar transistors are positioned form the collector of the transistor and cover buried n+-doped zones which are connected in the bipolar transistor zone by deep extending collector terminals.

A process of this type for 1 micron well CMOS bipolar technology for highly integrated circuits is disclosed, for example, in an article by Miyamoto et al in the IEDM 1983, Technical Digest, pages 63 to 66. A buried collector connected by a deep collector contact is used to reduce the collector resistance.

A 2 micron CMOS bipolar technology is also disclosed in an article by Alvarez et al in the IEDM 1984 Technical Digest on pages 761 to 764.

The production of a bipolar transistor which has a buried collector and self-aligned base-emitter zones, the emitter and base zones being formed by diffusion out of doped polysilicon structures, is disclosed in an article by Murrmann entitled "Modern Bipolar Technology for High Performance ICs" in the Siemens Research and Development Reports, Vol. 5 (1976), No. 6, pages 353 to 359 and in an article by Wieder entitled "Self-Aligned Bipolar Technology—New Chances for Very-High Speed Digital Integrated Circuits" in Siemens Researach and Development Reports, Vol. 13 (1984), pages 246 to 252. Transistors of this type are used in LSI circuits for high switching speeds.

SUMMARY OF THE INVENTION

The object of the invention is to provide a process for the production of highly integrated circuits containing CMOS and bipolar transistors to facilitate maximum system speeds. In the process, self-aligned bipolar transistors are produced simultaneously in a compatible manner with a high speed CMOS process. The process is arranged such that it effectively decouples the two transistor types, where the emitters of the bipolar transistors are doped independently of the production of the gate electrodes and the critical zones of the source/drain zones (lightly doped drain zones) of the n-channel MOS transistors, without a substantial increase in cost due to complicated masking steps.

In keeping with the present invention, the following process steps are combined in the new process:

(a) prior to the production of the layer structure which serves to contact the base contacts of the bipolar transistors, the active zones of the CMOS transistors are provided with a protective oxide in a thickness sufficient to function as an etch-stop layer and is used for structuring the base contact layer structure, (b) the gate electrode material consisting of polysilicon or a double layer composed of polysilicon and a refractory metal silicide is applied in two steps, with phosphorus doping being carried out following the first step. The first, doped layer together with the gate oxide is then removed from the bipolar transistor zones;

(c) the photo-resist mask used to structure the gate electrodes and the emitter and collector contacts is also used as an implantation mask for the production of the lightly doped source/drain terminal zones of the n-channel MOS transistors.

In the overall process of the present invention in which the n-zone forms the collector of the bipolar transistor and the n-zones cover buried n+-doped zones which are connected in the bipolar transistor by deeply extending collector terminals, the detailed steps of the process are recited below, in sequence:

(a) the implantation of n-doping ions into the p-doped substrate to produce buried n+-doped zones, (b) applying a p- or n-doped epitaxial layer to the entire surface, (c) applying a double layer composed of silicon oxide and silicon nitride, with appropriate structuring of the silicon nitride layer for the subsequent local oxidation (LOCOS), (d) producing a field oxide required to separate the active transistor zones in the substrate by local oxidation, following the removal of the photo-resist mask, and using the silicon nitride structure as an oxidation mask, (e) producing the n-zones and p-zones in the substrate by the implantation of n- and p-doping ions, and simultaneously producing the zones for the deeply extending collector terminal by deep implantation with n-doped ions and diffusing the ions inwardly, (f) removing the nitride/oxide mask, (g) producing a first insulating layer over the entire surface in a layer thickness which is sufficient to act as an etch-stop layer for the later structuring of the base contact layer structure, (h) using a photo-resist technique and etching away the bipolar transistor zones, consisting at least of the base zone and the emitter zone, from the first insulating layer, (i) depositing a p+-conducting layer composed of polysilicon, a refractory metal silicide, or a double layer consisting of polysilicon and metal silicide onto the entire surface following the removal of the photo-mask, (j) depositing a second insulating layer over the entire surface, (k) using a photo-resist technique and structuring the two layers with vertical sidewalls until the substrate is exposed, using a dry etching procedure in order to define the base zone of the bipolar transistors, (l) producing the active base zone by boron ion implantation following the photo-resist masking of the other zones, (m) depositing a third insulating layer after the removal of the photo-mask to cover the edges of the structures of the p+-conducting layer and the second insulating layer over the entire surface, (n) employing an anisotropic etching procedure in order to produce lateral insulating strips from the third insulating layer at the sidewalls of the p+-conducting layer structures and in order to etch free the substrate surfaces in the active zones of the MOS transistors and in the collector zone of the bipolar transistors, (o) applying a gate insulating layer of the MOS transistors, (p) depositing a first polysilicon layer having a layer thickness of less than 150 nm to the entire surface and doping this layer with phosphorus, (q) using a photo-resist technique and structuring the polysilicon layer and the underlying gate insulating layer in such a manner that the silicon substrate is exposed in the emitter and collector zones, and removing the photo-mask, (r) depositing a second polysilicon layer with a layer thickness in the range from 100 to 300 nm onto the entire surface, (s) using a photo-resist technique and structuring the first and second polysilicon layers in order to produce the gate electrodes of the MOS transistors and the collector and emitter contact zone of the bipolar transistors, (t) implanting phosphorus ions in order to produce the source/drain terminal zones of the n-channel MOS transistors and removing the mask which has been used for structuring in the previous process step, (u) implanting arsenic ions using a photo-resist technique in order to produce the source/drain zones of the n-channel transistors and in order to dope the emitter and collector zones of the bipolar transistors, (v) implanting boron ions using a photo-resist mask in order to produce the source/drain zones of the p-channel transistors, (w) producing an intermediate layer which serves as an insulating oxide, (x) using a high temperature treatment in the region of 900° C. for diffusing arsenic into the source/drain zones and into the emitter and collector zones and for diffusing boron into the source/drain zones and into the base contact zones, (y) opening the contact holes to the P+ and n+-conducting terminals of the active transistor zones and carrying out the normal metallization procedure.

In one form of the present invention, the production of the active base zone by boron ion implantation in accordance with process step (1) can be carried out without the use of a photoresist mask when the thickness of the first insulating layer which serves as a protective layer is properly selected, so that the base implantation and the channel implantation for the MOS transistors can be carried out in one step over the entire surface.

The process sequence in accordance with the invention necessitates only a small number of simple additional process steps in comparison to CMOS processes in double polysilicon gate technology (see, for example, the article by E. P. Jacobs et al, IEDM 84, Technical Digest (1984), pages 642 to 646). The simultaneous production of self-aligned bipolar transistors in double polysilicon technology provides the possibility of doping the emitter of the bipolar transistor with arsenic in order to produce a shallow pn-junction and of doping the source/drain zones of the MOS transistors with phosphorus in order to improve the breakdown voltage.

The use of polysilicon or polycide (polysilicon plus silicide) as an emitter material results in a higher emitter efficiency.

BRIEF DESCRIPTION OF THE DRAWINGS

The process sequence described above will be illustrated in connection with FIGS. 1–5 which show an exemplary embodiment. The Figures represent sectional diagrams of only those process steps which are essential to the invention and like reference numerals have been used for like components.

DESCRIPTION OF THE PREFERRED EMBODIMENT

Figure 1:
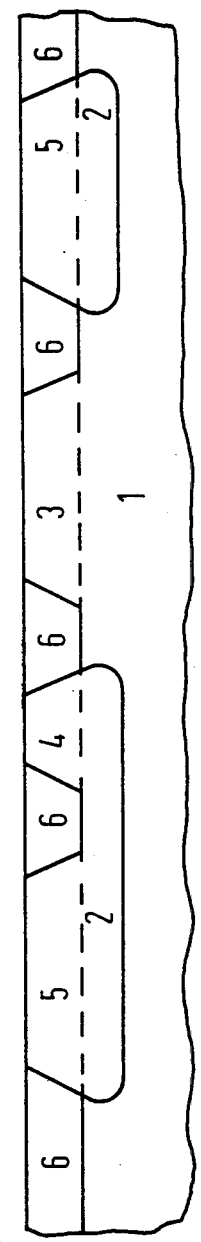
Figure 5:
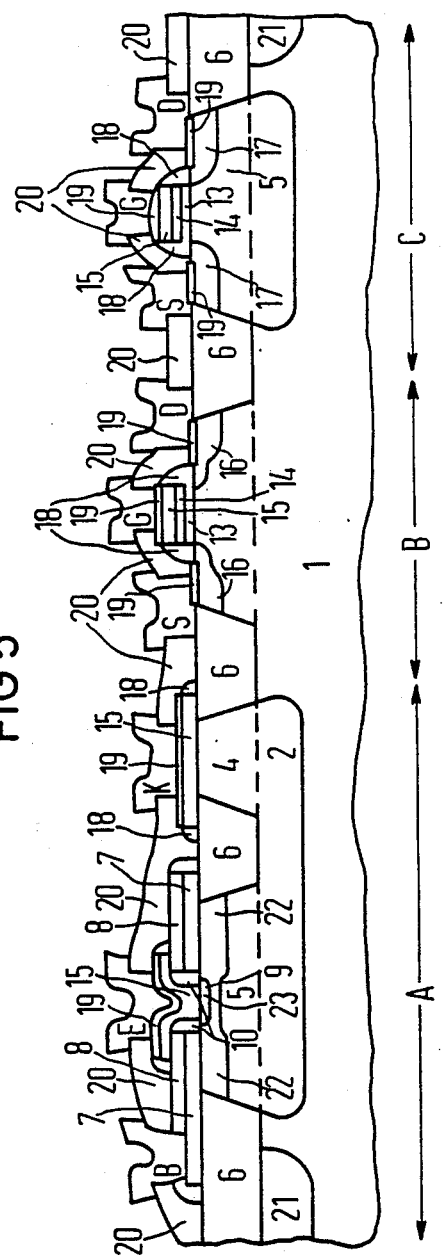

The arrangement shown in FIG. 1 is produced by the following steps:

(a) a buried collector zone 2 is formed in a p-doped silicon substrate 1 by masked ion implantation of antimony or arsenic at a dosage of $3 \times 10^{15}$ cm$^{-2}$ and an energy level of 80 keV, (b) a p-doped epitaxial layer 3 is deposited over the surface of the substrate 1, (c) a double layer composed of silicon oxide and silicon nitride are applied (not shown) and the silicon nitride layer is appropriately structured for the following LOCOS step, (d) a field oxide 6 is produced, to separate the active transistor zones identified at A, B and C on FIG. 5 in the substrate 1 by local oxidation using the silicon nitride structure produced in accordance with step (c) as an oxidation mask, (e) n-zone wells 5 are produced by masked phosphorus ion implantation at a dosage of $2 \times 10^{12}$ cm$^{-2}$ and an energy level of 180 keV, as well as zones for the deeply extending collector terminal by deep implantation with phosphorus ions at a dosage level of $3 \times 10^{15}$ cm$^{-2}$ and an energy level of 80 keV by diffusing-in. The collector terminal 4 is also driven into the collector zone 2, (f) the nitride/oxide mask is removed.

If necessary, the so-called channel-stop zones 21 can also be produced by boron ion implantation beneath the field oxide zone 6 as shown in FIG. 5.

Figure 2:
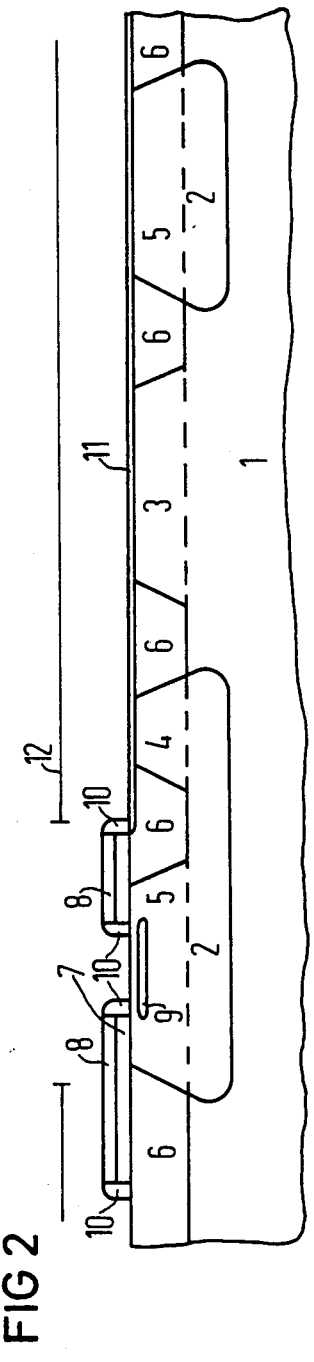

As shown in FIG. 2, the entire surface of the substrate 1 which contains the n- and p-doped zones 3, 4, 5 and the field oxide zones 6 is covered with an SiO$_2$ layer 11 which serves as a protective layer during the later base implantation. The SiO$_2$ layer 11 constitutes the first insulating layer and has a thickness in the range from 20 to 100 nm. It is structured by a photo-resist technique in such a manner that at least the base and emitter zones of the bipolar transistors A are exposed. The line identified at reference numeral 12 shown above the arrangement marks the surface zone which is covered with the protective oxide. After the removal of the photo-resist mask, the structure consisting of a p+-conducting layer 7 and a second insulating layer 8 is applied. The p+-conducting layer 7 consists of polysilicon or a refractory metal silicide and serves as a boron diffusion source for the production of the base terminal zone 22 of the bipolar transistors A. The insulating layer 8 consists of SiO$_2$. Structuring of the double layer 7, 8 is carried out by dry etching. For example, the SiO$_2$ layer 8 is subjected to reactive ion etching in a trifluoromethane/oxygen gas mixture and then by etching the polysilicon layer 7 in a carbon tetrachloride/helium plasma. Vertical sidewalls are obtained as a result of these etching procedures. The substrate should be subjected to the least possible etching (less than 50 nm). Following the structuring, the active base zone 9 is produced by the implantation of boron ions. When the thickness of the protective oxide 11 is appropriately selected, the channel implantation for the MOS transistors B, C can also be carried out over the entire surface, together with the base implantation for the bipolar transistors A. However, for independent optimization of the bipolar transistors A, the implantion of the base zone 9 can be restricted by a resist mask to the region of the bipolar transistors (without the collector terminal zone) as shown in FIG. 2. Finally, an SiO$_2$ layer which provides a good edge cover is applied to the entire surface and is structured by anisotropic etching, for example, by reactive ion etching using a CHF$_3$/O$_2$ gas mixture in such manner that lateral insulating strips 10 remain at the sidewalls of the p-conducting layer structure 7, 8. The substrate surface 1 together with the active zones of the MOS transistors B, C and the collector zone K of the bipolar transistors A are also exposed in this etching process.

Figure 3:
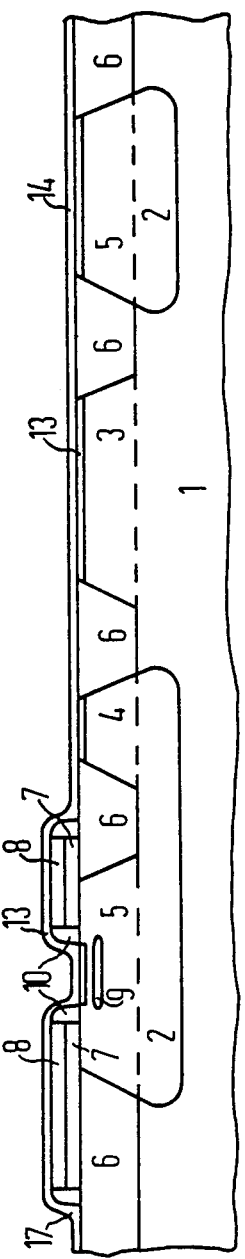

In FIG. 3 there is shown a further insulating layer 13 of a thickness of 5 to 50 nm which serves as a gate dielectric in the MOS transistor zones B, C. Then a first polysilicon layer 14 is applied at a layer thickness of less than 150 nm to the entire surface and is rendered n-conducting by phosphorus diffusion.

Figure 4:
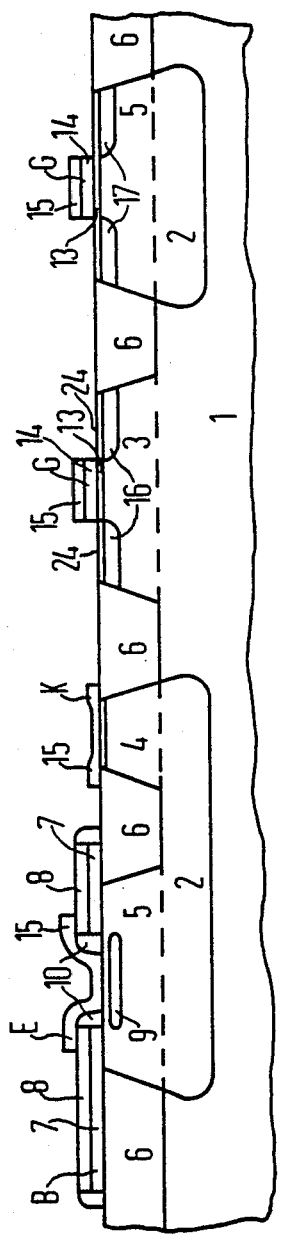

In FIG. 4, the polysilicon layer 14, doped with phosphorus, and the underlying insulating layer 13 have been structured by photolithography in such a manner that the substrate surface is re-exposed in the emitter and collector zones of the bipolar transistors A. Following the removal of the photo-mask, a second polysilicon layer 15 is applied in a layer thickness in the range of about 100 to 300 nm. Together with the underlying layer structures 13 and 14, a layer 15 is structured by photo-resist technology in such a manner that the gate electrodes G of the MOS transistors B, C and the emitter contact terminal E and collector contact terminal K of the bipolar transistors A are formed. Then the phosphorus implantation is carried out in order to produce the source/drain terminal zones 24 consisting of lightly doped drain zones for "soft" pn-junctions at the drain of the n-channel MOS transistors B. The mask used to structure the first and second polysilicon layers 14, 15 is removed and following a photolithographic step the arsenic ion implantation necessary to produce the source/drain zones 16 of the n-channel MOS transistors B and to dope the emitter and collector zones E, K of the bipolar transistors A is carried out in a known manner. Following a corresponding photo-resist masking step, the source/drain zones 17 of the p-channel MOS transistors C are produced in an identical manner.

As shown in FIG. 5, when the ions which produce the source/drain zones 16, 17 are diffused-in, for example, at 950° C., the dopant is simultaneously driven out of the structures 7, 15 which form the emitter terminal zones E and base terminal zones B and the base and emitter zones 22, 23 are produced. In order to avoid gate-drain overlap in the MOS transistors B, C, prior to the source/drain implantation steps to produce the zones 16, 17, and insulating oxide 18 can be produced on the sidewalls of the polysilicon layer structures 14, 15. The sidewall insulation 10 of the layer structure 7, 8 is also thereby strengthened. All of the active zones of transistors A, B, C, with the exception of the base terminal B which is formed by the structure 7, can be contacted by selective deposition of a metal or metal silicide. The silicide layer structure has been referenced 19 in FIG. 5. However, the contacting can also take place by self-aligned formation of a silicide on the exposed silicon surfaces.

The production of an intermediate layer 20 which serves as an insulating oxide, together with the opening of the contact holes to the p$^+$- and n$^+$-conducting layers 16, 17 and to the terminals, composed of the structures 7, 15, 19 of the base zone B, emitter zone E and the gate zone K of the bipolar transistors A and the gate electrodes G then takes place in a known manner. Subsequently, the metallization of the electrodes in accordance with conventional procedure is carried out.

FIG. 5 represents the finished transistor arrangement, also shows the channel-stop zones 21 which are produced under the field oxide zones 6 and which have been referred to in the description of FIG. 1. The function of the channel-stop zones is to provide a reliable insulation between adjacent collector zones since the threshold voltage of the parasitic thick oxide transistor is increased to values above the maximum operating voltage.

It will be evident that various modifications can be made to the described embodiments without departing from the scope of the present invention.

I claim as my invention:

1. A process for the simultaneous production of bipolar transistors and complementary MOS transistors on a p-doped silicon substrate which comprises:
    (a) implanting n-doping ions into said substrate to form buried n$^+$-doped zones,
    (b) applying a doped epitaxial layer to the entire surface of said substrate,
    (c) applying a double layer of silicon oxide and silicon nitride over said surface,
    (d) producing field oxide regions to separate the active transistor zones in said substrate by local oxidation using the silicon nitride layer as an oxidation mask,
    (e) producing n-zones and p-zones in said substrate by implanting n- and p-doping ions and simultaneously producing zones for a deeply extending collector terminal,
    (f) removing the oxide/nitride double layer,
    (g) producing a first insulating layer over the entire surface with a thickness sufficient to provide an etch-stop layer for the subsequent structuring of the base contact layer structure,
    (h) etching away said first insulating layer from the bipolar transistor zones at least in the base zone and the emitter zone,
    (i) depositing a p$^+$-conducting layer of polysilicon, a metal silicide or a double layer of polysilicon and metal silicide over the entire surface,
    (j) depositing a second insulating layer over the entire surface,
    (k) etching the two layers to produce vertical sidewalls therein, to expose the substrate and define the base zone of said bipolar transistors,
    (l) implanting boron ions to form an active base zone in said substrate,
    (m) depositing a third insulating layer over the entire surface to provide edge coverages of said p$^+$-conducting layer and said second insulating layer,
    (n) anisotropically etching said substrate to form lateral insulating strips at the sidewalls of the p$^+$-conducting layer structures and to etch free the substrate surfaces in the active zones of the MOS transistors and in the collector zone of the bipolar transistors,
    (o) applying a gate insulating layer on the MOS transistors, (p) depositing a first polysilicon layer over the entire surface to a thickness of less than 150 nm, and doping said layer with phosphorus ions, (q) structuring said first polysilicon layer and the underlying gate insulating layer such that the silicon substrate surface is exposed in the emitter and collector zones, (r) depositing a second polysilicon layer over the entire surface to a thickness of from 100 to 300 nm, (s) structuring said first and second polysilicon layers to produce gate electrodes of the MOS transistors and the collector and emitter contact zones of said bipolar transistors, (t) implanting phosphorus ions to produce the source/drain terminal zones of the n-channel MOS transistors, (u) implanting arsenic ions to produce the source/drain zones of the n-channel transistors and to dope the emitter and collector zones of the bipolar transistors, (v) implanting boron ions to produce the source/drain zones of the p-channel transistors, (w) applying an intermediate layer serving as an insulating oxide, (x) subjecting the substrate to a high temperature on the order of 900° C. to diffuse arsenic into the source/drain zones and into the emitter and collector zones as well as to diffuse boron into the source/drain zones and into the base contact zones, and (y) applying metallic electrodes.

2. A process according to claim 1 wherein process step (1) is carried out without photo-resist masking.

3. A process according to claim 1 wherein between process steps (t) and (u) the sidewalls of the gate electrodes of the MOS transistor, of the collector and emitter contacts, and of the base contact covered by said third insulating layer are provided with an additional SiO$_2$ layer.

4. A process according to claim 1 in which prior to the formation of said metallic electrodes, the contacts of all the active zones of the transistors except for the base terminal zone of the bipolar transistor are provided with a metallization by the selective deposition of a metal silicide or a metal which forms a silicide.

5. A process according to claim 1 wherein following process step (c), silicon etching is carried out in the field oxide zones to obtain a planar surface.

6. A process according to claim 1 wherein prior to process step (d) boron implantation is carried out to produce channel-stop zones beneath the field oxide zones.

7. A process for the simultaneous production of self-adjusted bipolar transistors and complementary MOS transistors on a doped silicon substrate which comprises:

providing active zones for the MOS transistors in said substrate, applying a protective oxide layer over said active zones, said protective oxide layer having a thickness sufficient to function as an etch-stop layer for the structuring of the subsequently formed base contact layer structure, applying a gate electrode material consisting of a first layer of (a) polysilicon or (b) a double layer of polysilicon and metal silicide over the entire surface, doping said polysilicon layer with phosphorus, removing the doped layer and oxide layer from the zones where the bipolar transistors are to appear, depositing a second polysilicon layer over the entire surface, structuring the first and second polysilicon layers with a photoresist mask to produce gate electrodes and emitter and collector contact zones, and implanting lightly doped source/drain terminal zones of the n-channel MOS transistors using the same photoresist mask used for structuring said gate electrodes and emitter.

* * * * *